United States Patent
Ok et al.

(10) Patent No.: US 11,476,418 B2
(45) Date of Patent: Oct. 18, 2022

(54) PHASE CHANGE MEMORY CELL WITH A PROJECTION LINER

(71) Applicant: INTERNATIONAL BUSINESS MACHINES CORPORATION, Armonk, NY (US)

(72) Inventors: Injo Ok, Loudonville, NY (US); Ruqiang Bao, Niskayuna, NY (US); Andrew Herbert Simon, Fishkill, NY (US); Kevin W. Brew, Niskayuna, NY (US); Nicole Saulnier, Slingerlands, NY (US); Iqbal Rashid Saraf, Glenmont, NY (US); Prasad Bhosale, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 17/114,605

(22) Filed: Dec. 8, 2020

(65) Prior Publication Data
US 2022/0181547 A1    Jun. 9, 2022

(51) Int. Cl.
H01L 45/00        (2006.01)

(52) U.S. Cl.
CPC ............ *H01L 45/126* (2013.01); *H01L 45/06* (2013.01); *H01L 45/1233* (2013.01)

(58) Field of Classification Search
CPC .................................................. H01L 45/126
See application file for complete search history.

(56) References Cited

U.S. PATENT DOCUMENTS

| 5,536,947 | A  | 7/1996 | Klersy |
| 8,144,508 | B2 | 3/2012 | Franceschini |
| 8,809,829 | B2 | 8/2014 | Lee |
| 9,059,404 | B2 | 6/2015 | Brightsky |
| 9,246,093 | B2 | 1/2016 | Zanderighi |
| 9,257,639 | B2 | 2/2016 | Kim |

(Continued)

FOREIGN PATENT DOCUMENTS

| CN | 1702883 A | 11/2005 |
| CN | 1892889 A | 1/2007 |

(Continued)

OTHER PUBLICATIONS

IBM: List of IBM Patents or Patent Applications Treated as Related (Appendix P), Dec. 22, 2020, 2 pages.

(Continued)

*Primary Examiner* — Mounir S Amer
(74) *Attorney, Agent, or Firm* — L. Jeffrey Kelly

(57) ABSTRACT

A semiconductor structure may include a heater surrounded by a second dielectric layer, a projection liner on top of the second dielectric layer, and a phase change material layer above the projection liner. A top surface of the projection liner may be substantially flush with a top surface of the heater. The projection liner may separate the phase change material layer from the second dielectric layer. The projection liner may provide a parallel conduction path in the crystalline phase and the amorphous phase of the phase change material layer. The semiconductor structure may include a bottom electrode below and in electrical contact with the heater and a top electrode above and in electrical contact with the phase change material layer.

14 Claims, 12 Drawing Sheets

(56) References Cited

U.S. PATENT DOCUMENTS

| | | | |
|---|---|---|---|
| 9,293,199 | B2 | 3/2016 | Krebs |
| 9,530,493 | B2 | 12/2016 | Eleftheriou |
| 9,570,169 | B1 | 2/2017 | Czornomaz |
| 9,666,273 | B2 | 5/2017 | Papandreou |
| 10,395,732 | B2 | 8/2019 | Czornomaz |
| 10,573,811 | B2 | 2/2020 | Tseng |
| 2003/0209746 | A1 | 11/2003 | Horii |
| 2009/0236583 | A1* | 9/2009 | Kuo .............. H01L 45/143 438/54 |
| 2012/0048768 | A1 | 3/2012 | Holloway |
| 2013/0336047 | A1 | 12/2013 | Hokenmaier |
| 2014/0369113 | A1* | 12/2014 | Krebs ............. H01L 45/06 365/163 |
| 2014/0369114 | A1 | 12/2014 | Kim |
| 2018/0040817 | A1* | 2/2018 | Chuang ......... H01L 45/1233 |
| 2019/0140171 | A1 | 5/2019 | Brightsky |
| 2019/0148637 | A1 | 5/2019 | Ando |
| 2020/0091427 | A1 | 3/2020 | Ando |
| 2020/0381618 | A1 | 12/2020 | Cappelletti |
| 2021/0091307 | A1 | 3/2021 | Brightsky |

FOREIGN PATENT DOCUMENTS

| | | |
|---|---|---|
| CN | 106206938 A | 12/2016 |
| EP | 2034536 A1 | 3/2009 |
| EP | 2034536 B1 | 11/2010 |
| TW | 200744205 A | 1/2007 |

OTHER PUBLICATIONS

Pending U.S. Appl. No. 17/114,594, filed Dec. 8, 2020, entitled: "Phase Change Memory Cell With a Wrap Around and Ring Type of Electrode Contact and a Projection Liner", 29 pages.

Ding et al., "Phase-change heterostructure enables ultralow noise and drift for memory operation", Phase-Change Memory, Research, Science, 366, pp. 210-215, Oct. 11, 2019.

Koelmans et al., "Projected phase-change memory devices", nature Communications, Article, Accepted Jul. 27, 2015, Published Sep. 3, 2015, pp. 1-7.

Li et al., "Understanding phase-change materials with unexpectedly low resistance drift for phase-change memories", Journal of Materials Chemistry C, Issue 13, 2018, 6 pages, Accessed on Jul. 14, 2020.

Sarwat, "Materials science and engineering of phase change random access memory", Materials Science and Technology, vol. 33, No. 16, Published online Jul. 18, 2017, 1890-1906.

Sebastian et al., "Computational phase-change memory: beyond von Neumann computing", Journal of Physics D: Applied Physics, 52 (2019), Published Aug. 20, 2019, pp. 1-14.

Notification of Transmittal of the International Search Report and the Written Opinion of the International Searching Authority, or the Declaration, dated Mar. 2, 2022, International application No. PCT/IB2021/060700, 12 pages.

Notification of Transmittal of the International Search Report and the Written Opinion of the International Searching Authority, or the Declaration, dated Mar. 2, 2022, International application No. PCT/IB2021/060692, 11 pages.

* cited by examiner

PHASE CHANGE MEMORY CELL WITH A PROJECTION LINER

BACKGROUND

The present invention relates generally to a phase change memory cell, and more particularly, to a method and structure for forming a type phase change memory cell with a projection liner.

A phase change memory cell may be used for data storage. The phase change memory cell is a non-volatile random-access memory. A typical configuration of a phase change memory cell may include a phase change material arranged between, and coupled to, at least two electrodes. When the phase change memory cell is in use, the phase change material may be operated in one of at least two reversibly transformable phases, an amorphous phase, and a crystalline phase. The amorphous phase and the crystalline phase are distinct from one another. In the amorphous phase, the phase change material has a discernibly higher resistance when compared to the crystalline phase. In order to facilitate a phase transition, energy is supplied to the phase change material such as, for example, electrical energy, thermal energy, any other suitable form of energy or combination thereof that may effectuate a desired phase transition.

To facilitate a change from the crystalline phase to the amorphous phase, an electrical energy, such as a voltage pulse, may be applied to one of the electrodes, for example a bottom electrode, causing the phase change material at the electrode, or substantially in the vicinity thereof, to heat above its melting temperature. The phase change material is then rapidly cooled below its glass temperature. The phase change material that is treated in this way is transformed from the crystalline phase to the amorphous phase. An amorphized area is created in the phase change material where such a phase transition has occurred.

SUMMARY

According to one embodiment of the present invention, a semiconductor structure is provided. The semiconductor structure may include a heater surrounded by a second dielectric layer, a projection liner on top of the second dielectric layer, and a phase change material layer above the projection liner. A top surface of the projection liner may be substantially flush with a top surface of the heater. The projection liner may separate the phase change material layer from the second dielectric layer. The semiconductor structure may include a bottom electrode below and in electrical contact with the heater and a top electrode above and in electrical contact with the phase change material layer. The semiconductor structure may also include a mask layer above and in direct contact with the top electrode, a top electrode contact above and in electrical contact with the top electrode, and a bottom electrode contact below and in electrical contact with the bottom electrode. The phase change material layer may include a crystalline phase and an amorphous phase. The amorphous phase may be directly above the heater. The projection liner may provide a parallel conduction path in the crystalline phase and the amorphous phase of the phase change material layer. The projection liner may laterally extend beyond the amorphous phase of the phase change material layer. The heater may include an outer layer, a middle layer, and an inner layer. The middle layer may be between the outer layer and an inner layer, and the inner layer may be surrounded by the middle layer.

According to another embodiment of the present invention, a semiconductor structure is provided. The semiconductor structure may include a heater within a second dielectric layer, a projection liner on top of the second dielectric layer, and a phase change material layer above the projection liner. The top portion of the heater may vertically extend above the second dielectric layer. The projection liner may be on top and in direct contact with the top portion of the heater that vertically extends above the second dielectric layer. The projection liner may separate the phase change material layer from the heater and the second dielectric layer. The projection liner may provide a parallel conduction path in the crystalline phase and the amorphous phase of the phase change material layer. The semiconductor structure may include a bottom electrode below and in electrical contact with the heater and a top electrode above and in electrical contact with the phase change material layer. The semiconductor structure may also include a mask layer above and in direct contact with the top electrode, a top electrode contact above and in electrical contact with the top electrode, and a bottom electrode contact below and in electrical contact with the bottom electrode. The phase change material layer may include a crystalline phase and an amorphous phase. The amorphous phase may be directly above the heater. The projection liner may laterally extend beyond the amorphous phase of the phase change material layer. The heater may include an outer layer, a middle layer, and an inner layer. The middle layer may be between the outer layer and an inner layer, and the inner layer may be surrounded by the middle layer.

According to another embodiment of the present invention, a semiconductor structure is provided. The semiconductor structure may include a heater within a second dielectric layer and a phase change material layer above and in direct contact with the second dielectric layer. A top portion of the heater may vertically extend above the second dielectric layer. The semiconductor structure may include a bottom electrode below and in electrical contact with the heater and a top electrode above and in electrical contact with the phase change material layer. The semiconductor structure may also include a mask layer above and in direct contact with the top electrode, a top electrode contact above and in electrical contact with the top electrode, and a bottom electrode contact below and in electrical contact with the bottom electrode. The phase change material layer may include a crystalline phase and an amorphous phase. The amorphous phase may be directly above the heater. The heater may include an outer layer, a middle layer, and an inner layer. The middle layer may be between the outer layer and an inner layer, and the inner layer may be surrounded by the middle layer. The semiconductor structure may also include a first metal layer below and in electrical contact with the bottom electrode contact, a second metal layer above and in electrical contact with the top electrode contact, and a via contact between and in electrical contact with the first metal layer and the second metal layer.

BRIEF DESCRIPTION OF THE DRAWINGS

The following detailed description, given by way of example and not intend to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
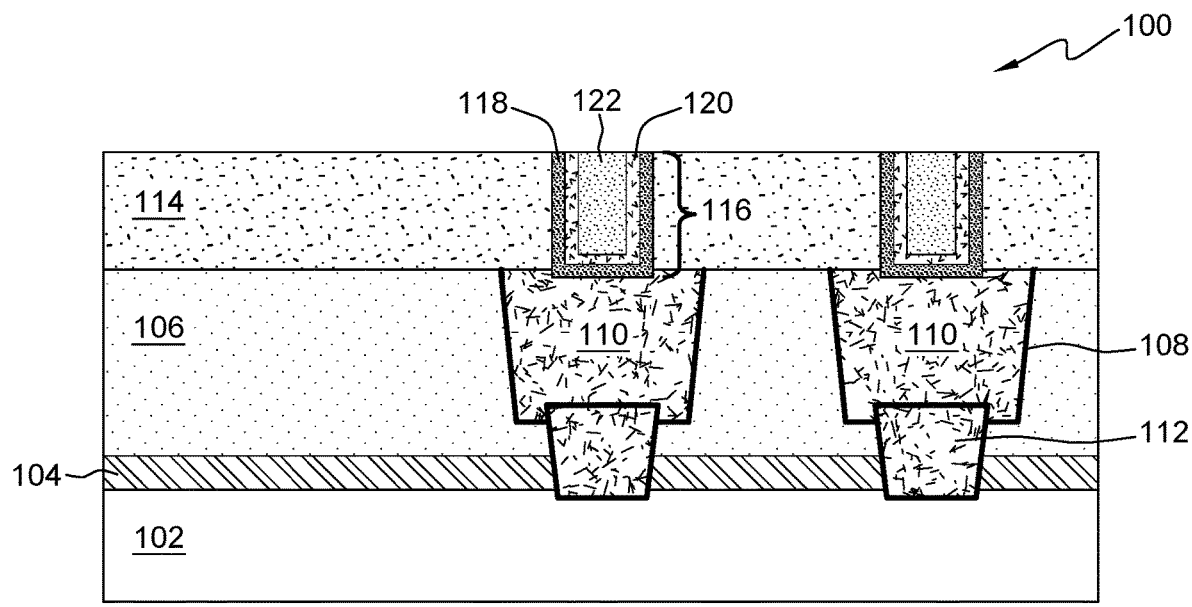
FIG. 1 is a cross section view illustrating heaters within a second dielectric layer according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

When the phase change memory cell is in use, the phase change material may be operated in one of at least two reversibly transformable phases, an amorphous phase, and a crystalline phase. The amorphous and crystalline phases may also be referred to as the amorphous and crystalline states. The amorphous state of the phase change material has high resistance and low conductance whereas the crystalline state of the phase change material has low resistance and high conductance. The amorphous and crystalline states may be used to program different data values within a phase change memory cell.

The programming of different data values within a phase change memory cell may be accomplished by using electrodes, such as, for example, a bottom electrode and a top electrode, to supply appropriate voltages to the phase change material. Depending on the applied voltage, the phase change material goes from either the crystalline state to the amorphous state, or vice versa. Further, a phase change material cell may have different programming levels. Each programming level may correspond with a different voltage that was applied to the phase change material to program it. Once the phase change material cell is programmed (write operation), a read voltage may be applied, using the electrodes, to retrieve information stored at that phase change material level. The read voltage may be sufficiently low to ensure that application of the read voltage does not disturb the programmed cell state.

However, once the phase change material cell is programmed, the resistance of the phase change memory may exhibit resistance drift. More particularly, it is the amorphous state that may exhibit the resistance drift. That is, the resistance of the amorphous state cell may increase over time. This may make the resistance of the phase change memory cell unpredictable. Therefore, it would be advantageous to mitigate resistance drift, thus making the resistance of the phase change material predictable and repeatable. Further, mitigating resistance drift allows for the phase change material cell to have resistance that may change linearly with the applied programming pulses.

To mitigate resistance drift without compromising any attributes of the phase change memory cell, embodiments of the present invention provide a phase change memory cell structure with a projection liner, and a method of forming the structure. Further, embodiments of the present invention provide a phase change memory cell with a heater that vertically extends above a dielectric layer into the phase change material layer.

Referring now to FIG. 1, a structure 100 is shown, in accordance with an embodiment. The structure 100 may include a metal layer 102, an NBLOK 104, a first dielectric layer 106, a barrier layer 108, bottom electrodes 110, bottom electrode contacts 112, a second dielectric layer 114, and a heater 116. The metal layer 102 may be made of metal, such as, for example copper. The metal layer 102 may be referred to as the first metal layer. The NBLOK 104 is a barrier film used in copper chips. The NBLOK 104 may be made of nitrogen doped silicon carbide or carbon doped silicon nitride. The NBLOK 104 may be formed on the metal layer 102 using standard deposition methods. The NBLOK 104 may be referred to as the first NBLOK.

The first dielectric layer 106 may be deposited on a top surface of the NBLOK 104 using known deposition techniques, such as, for example, atomic layer deposition (ALD), chemical vapor deposition (CVD), or physical vapor deposition (PVD). The first dielectric layer 106 may be made of any suitable low-k dielectric material, TEOS, or a bi-layer of TEOS and NBLOK. The bottom electrodes 110 may be formed within a trench in the first dielectric layer 106. Once the trench (now shown) is formed, the barrier layer 108 may be conformally deposited using known deposition techniques, such as, for example, ALD. The barrier layer 108 may be made of tantalum nitride (TaN), titanium nitride (TiN), or any combination thereof. The barrier layer 108 prevents the material, forming the bottom electrode 110, from migrating into the first dielectric layer 106. The trench is then filled with a conductive material, such as, for example, copper, tungsten, cobalt, or aluminum, forming the bottom electrode 110. A planarization process, such as, for example, chemical mechanical polishing (CMP), is done to remove excess material from a top surface of the structure 100.

In addition to the bottom electrodes 110, the structure includes the bottom electrode contacts 112. The bottom electrode contacts 112 may be formed using standard deposition and lithography methods. The bottom electrode contacts 112 may be made of conductive metals such as, for example, copper, tungsten, cobalt, or aluminum, to allow for current to pass through the bottom electrodes 110 and the bottom electrode contacts 112. The bottom electrode contacts 112 are below and in electrical contact with the bottom electrodes 110. The bottom electrode contacts 112 are above and in electrical contact with the metal layer 102. Although two bottom electrodes 110 and two bottom electrode contacts 112 are shown, it should be appreciated that embodiments of the present invention may include any number of bottom electrodes 110 and two bottom electrode contacts 112.

Once the bottom electrodes 110 are formed, the second dielectric layer 114 is deposited on a top surface of the structure 100 using known deposition techniques, such as, for example, ALD, CVD, or PVD. The second dielectric layer 114 may be made of dielectric material, such as, for example, silicon nitride, to a thickness of about 50 nm.

With continued reference to FIG. 1, the heater 116 is formed within the second dielectric layer 114 above the bottom electrode 110 such that the bottom electrode 110 is below and in electrical contact with the heater 116. The heaters 116 are surrounded by the second dielectric layer 114. Although two heaters 116 shown, it should be appreciated that embodiments of the present invention may include any number of heaters 116. Each heater 116 includes an outer layer 118, a middle layer 120, and an inner layer 122. The heater 116 extends through the second dielectric layer 114 to the bottom electrode 110 and is formed within a trench. To remove the second dielectric layer 114 and form the heater 116, a resist, such as a photoresist, may be deposited and patterned. An etch process, such as a reactive ion etch (RIE), may be performed using the patterned resist as an etch mask to remove the second dielectric layer 114 until the bottom electrode 110 is exposed. The outer layer 118 may be conformally deposited within the trench, using deposition process, such as, for example, ALD, to a thickness of about 5 nm. The outer layer 118 may be made of material such as, for example, TaN. The middle layer 120 may be conformally deposited on top of the outer layer 118, within the trench, using deposition process, such as, for example, ALD, to a thickness of about 6 nm. The middle layer 120 may be made of material such as, for example, TiN. The inner layer 122 may be conformally deposited on top of the middle layer 120, filling the trench, using deposition process, such as, for example, ALD, to a thickness of about 20 nm. The middle layer 120 is between the outer layer 118 and the inner layer 122. The inner layer 122 may be made of material such as, for example, TaN. The inner layer 122 is surrounded by the middle layer 120. Once the heater 116 is formed, a CMP process may be used to remove excess portions of the outer layer 118, the middle layer 120, and the inner layer 122 remaining on top surfaces of the structure 100.

Figure 2:
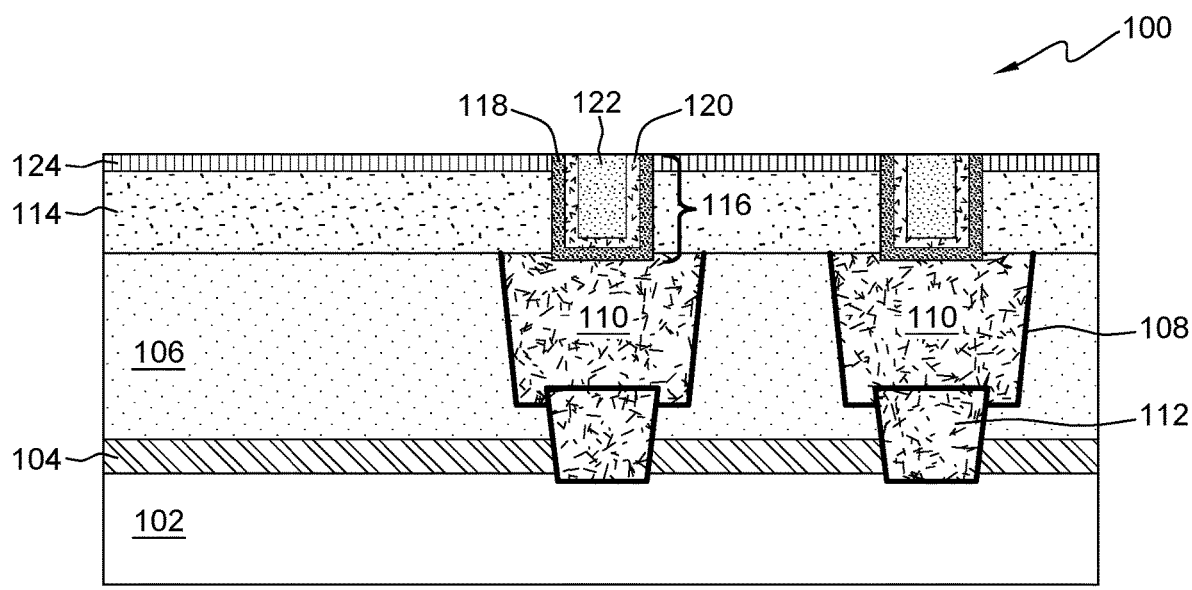
FIG. 2 is a cross section view illustrating a projection liner above the heaters according to an exemplary embodiment.

Referring now to FIG. 2, the structure 100 with a projection liner 124 is shown, in accordance with an embodiment. After the heaters 116 are formed, the second dielectric layer 114 is recessed, using an etch process such as, a wet etch or a reactive ion etch (RIE) process, such that a top portion of each heater 116 is exposed. The projection liner 124 is then conformally deposited onto the top surface of the structure 100, covering the exposed top portions of the heaters 116 such that a top surface of the projection liner 124 is substantially flush with a top surface of the heater 116.

The projection liner 124 may be made of a non-insulating material such as, a metal or a metal nitride, where the metal component may be a refractory material such as, for example, molybdenum, tungsten, titanium, tantalum, or the like. For example, the projection liner 124 may be made of nitrogen rich TiN. A CMP process is then performed to remove the excess projection liner 124 and expose the top surfaces of the heaters 116. The projection liner 124 laterally extends from the heater 116 and covers the top surface of the second dielectric layer 114. The projection liner 124 may laterally extend beyond the amorphous phase 126b of the phase change material layer 126 that is above the heater 116. The projection liner 124 enables current to pass from the bottom electrode 110 through a phase change material layer to a top electrode, bypassing an amorphous portion of the phase change material layer.

Figure 3:
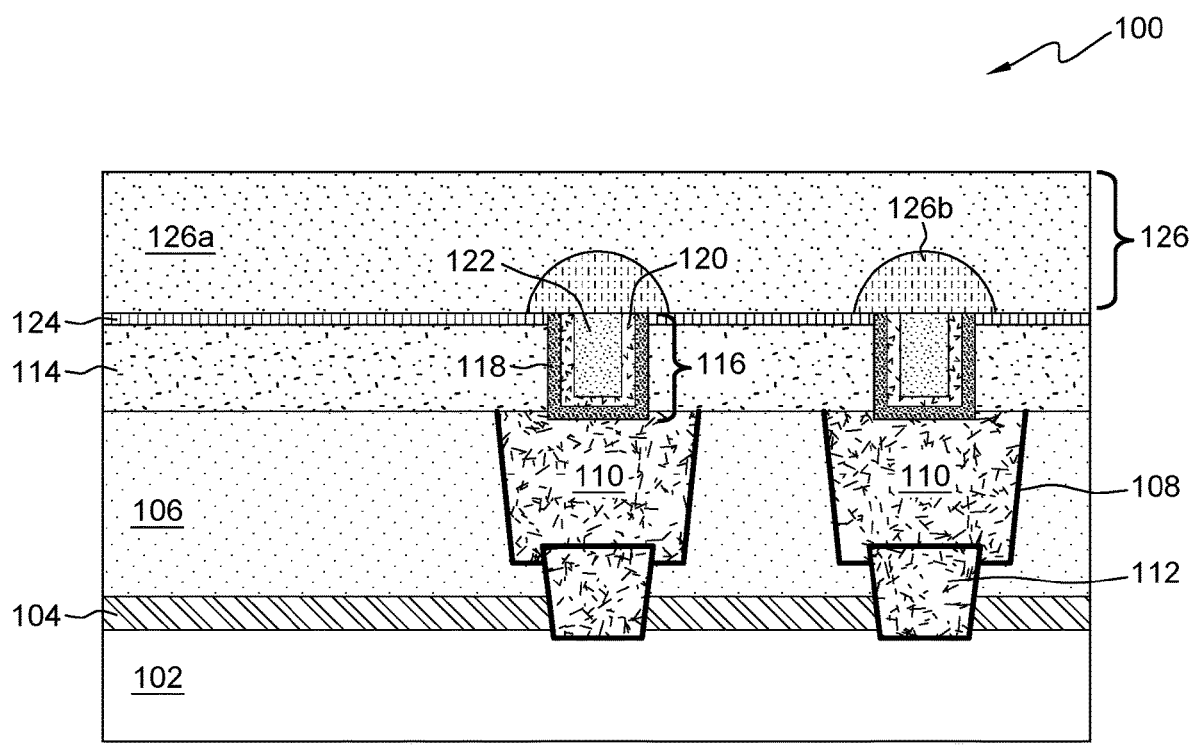
FIG. 3 is a cross section view illustrating a phase change material layer above the heaters according to an exemplary embodiment.

Referring now to FIG. 3, the structure 100 with a phase change material layer 126 is shown, in accordance with an embodiment. The phase change material layer 126 may be deposited onto the top surface of the structure 100 using known deposition methods such as, ALD. The phase change material layer 126 may include both a crystalline phase 126a and an amorphous phase 126b. The amorphous phase 126b may be directly above the heater 116. The phase change material layer 126 may be formed from a class of materials preferably including chalcogenide based materials. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag).

Many phase change based memory materials have been described in technical literature, including alloys of Ga/Sb. In/Sb. In/Se, Sb/Te, Ge/Te, Ge/Sb/Te, In/Sb/Te, Ga/Se/Te, Sn/Sb/Te, In/Sb/Ge. Ag/In/Sb/Te, Ge/Sn/Sb/Te, Ge/Sb/Se/Te and Te/Ge/Sb/S. In the family of Ge/Sb/T alloys, a wide range of alloy compositions may be workable. The compositions can be characterized as $TeGe.Sb_{100-(a+b)}$. More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties.

Figure 4:
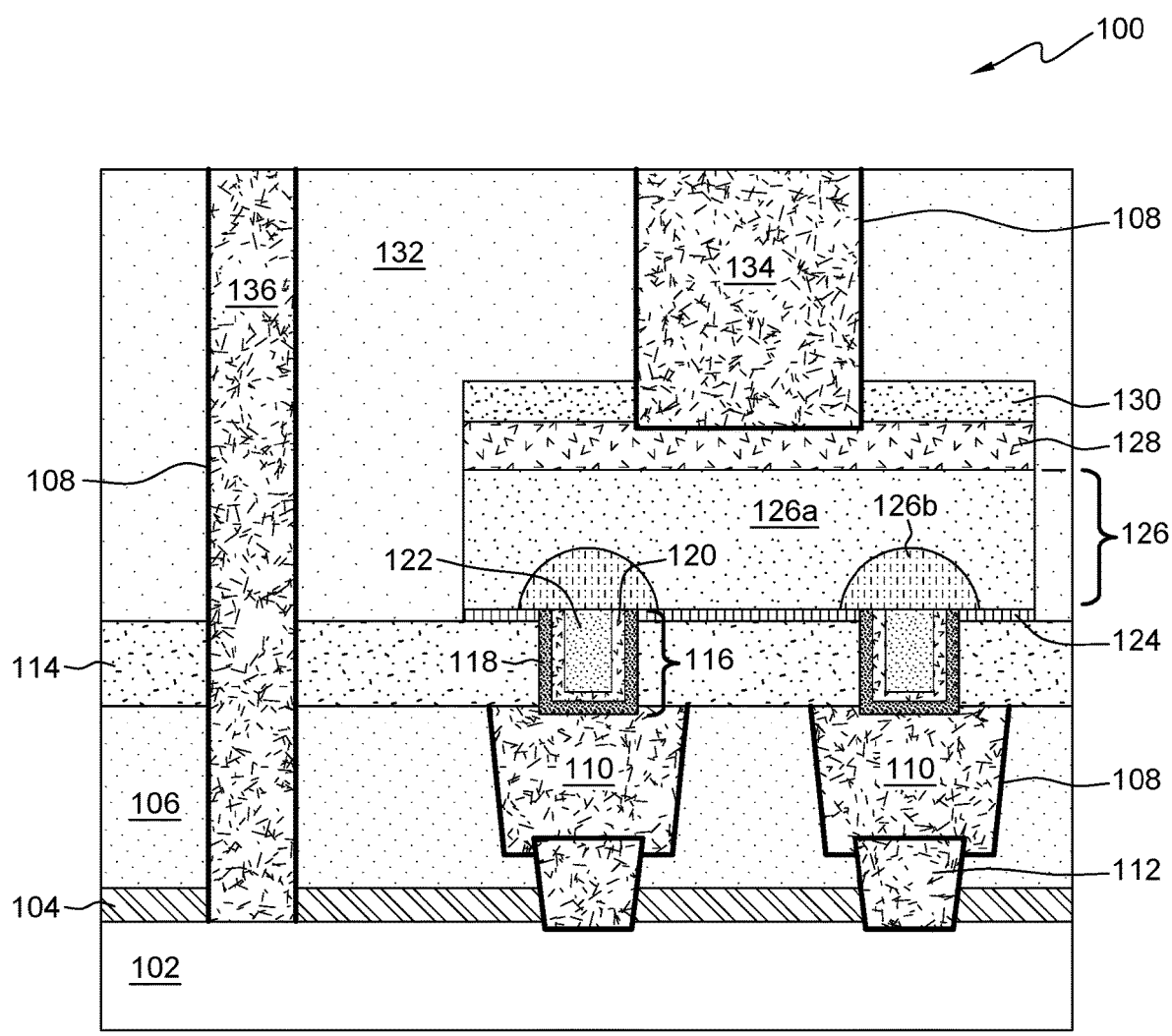
FIG. 4 is a cross section view illustrating a top electrode, a top electrode contact, and a via contact according to an exemplary embodiment.

Referring now to FIG. 4, the structure 100 with a top electrode 128, a mask layer 130, a third dielectric layer 132, a top electrode contact 134, and a via contact 136 is shown, in accordance with an embodiment. The top electrode 128 is deposited on top of the phase change material layer 126 to allow for the current to pass from the bottom electrodes 110 through the phase change material layer 126 to the top electrode 128. The top electrode 128 is above and in electrical contact with the phase change material layer 126. Known suitable deposition techniques, such as, for example, ALD, CVD, or PVD may be used to form the top electrode 128. The top electrode 128 is in direct contact with the phase change material layer 126. The top electrode 128 may be made from substantially the same conductive material as the bottom electrodes 110, such as, for example, TiN.

The mask layer 130 is deposited on top of the top electrode 128 using known deposition techniques. The mask layer 130 is in direct contact with the top electrode 128. The mask layer 130 may be made of a dielectric material such as, for example, silicon dioxide, silicon nitride, and/or silicon oxynitride. In some embodiments, the mask layer 130 can be formed utilizing a conventional deposition process such as, for example, CVD or PVD. The mask layer 130 is then patterned (not shown). Patterning may be performed by lithography and etching. An etch process, such as, for example, a RIE process may be performed to remove portions of the mask layer 130, the top electrode 128, the phase change material layer 126, and the projection liner 124. The resultant structure 100 includes portions of the projection liner 124, the phase change material layer 126, the top electrode 128, and the mask layer 130 remaining directly above the heaters 116.

After the mask layer 130 is patterned, the third dielectric layer 132 is deposited onto the top surface of the structure 100 such that the third dielectric layer 132 covers the remaining portions of the projection liner 124, the phase change material layer 126, the top electrode 128, and the mask layer 130. The third dielectric layer 132 may be made of any suitable dielectric material, such as, for example, silicon nitride, silicon based low-k dielectrics, or TEOS. Known suitable deposition techniques, such as, for example, ALD, CVD, or PVD may be used to form the third dielectric layer 132. The third dielectric layer 132 is made of materials that have low thermal conductivity. As a result, the third dielectric layer 132 function as an insulator.

With continued reference to FIG. 4, the structure 100 is patterned to create a via contact opening and a top electrode contact opening (not shown). The top electrode contact opening extends from the top surface of the third dielectric layer 132 through the mask layer 130 to the top electrode 128. The via opening extends from the top surface of the third electric layer 132, through the second and first dielectric layers 114, 106, through the NBLOK 104, to the metal layer 102. The barrier layer 108 is then deposited within both the via opening and the top electrode opening. The openings are then filled with a conductive material such as, for example, copper tungsten, cobalt, or aluminum, forming the top electrode contact 134 and the via contact 136. A CMP may then be performed to remove excess material from a top surface of the structure 100. The top electrode contact 134 is above and in electrical contact with the top electrode 128. The via contact 136 is between and in electrical contact with the first metal layer 102 and the second metal layer 140.

Figure 5:
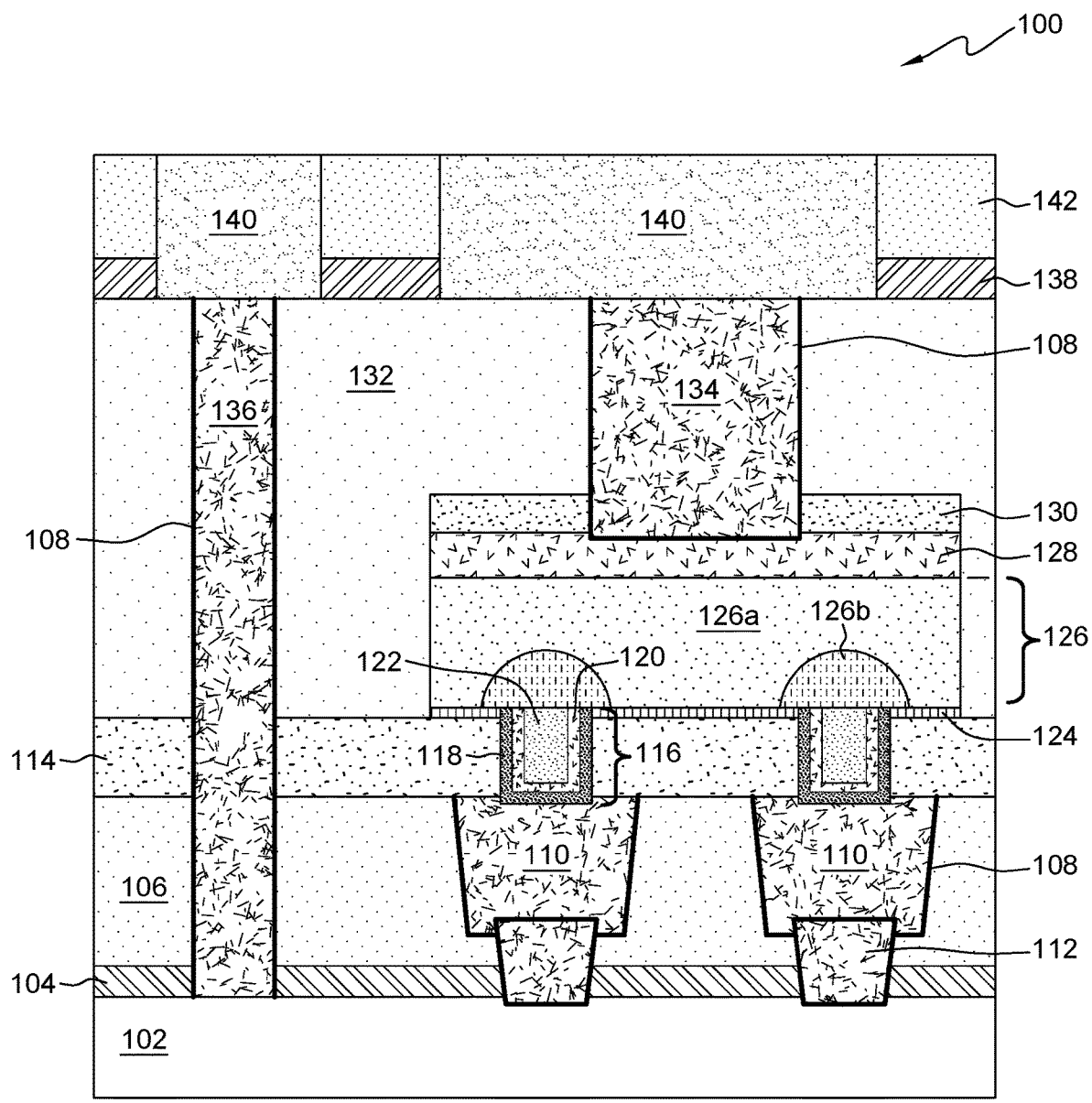
FIG. 5 is a cross section view illustrating a second metal layer on top of the top electrode contact according to an exemplary embodiment.

After the top electrode contact 134 and the via contact 136 are formed, the structure 100 may undergo further processing to form a second NBLOK layer 138 and a second metal layer 140, as is illustrated in FIG. 5. Using known deposition techniques, the second NBLOK layer 138 may be deposited onto the top surface of the structure 100. The second NBLOK layer 138 may be made of substantially the same material as the first NBLOK layer 104. On top of the second NBLOK layer 138, the second metal layer 140 may be deposited, using known deposition techniques. The second metal layer 140 is made from substantially the same material as the first metal layer 102. A bottom surface of the second metal layer 140 is in direct contact with the top surface of the top electrode contact 134 and the top surface of the via contact 136. The second metal layer 140 is then patterned and a fourth dielectric layer 142 is be deposited. The fourth dielectric layer 142 is made of substantially the same material as the first dielectric layer 106.

FIGS. 1-5 provide a method of fabricating a phase change memory cell with the projection liner 124. The phase change memory cell may be referred to as a mushroom type phase change memory cell due to the shape of the amorphous phase 126b of the phase change material layer 126. The resultant structure 100, as illustrated in FIG. 5, includes the projection liner 124 separating the second dielectric layer 114 from the phase change material layer 126. The projection liner 124 is parallel to the phase change material layer 126.

The resistance of the projection liner 124 is chosen such that the projection liner 124 has a marginal influence on the write operation (during which the phase transition occurs), but a significant influence on the read operation. This is indeed possible because electrical transport in the amorphous phase 126b is highly nonlinear. At high fields, the amorphous material undergoes the so-called electronic threshold switching, leading to a low-resistive state (ON state). Thus, if during the high-field write process the resistance of the projection liner 124 is significantly higher than the ON-state resistance of the amorphous phase 126b, most of the current will flow through the phase change material layer 126. During the low-field read process, however, the current bypasses the highly resistive amorphous phase 126b and flows through that part of the projection liner 124 that is parallel to it. Hence, the resistance of the device is dominated by the resistance of that part of the projection liner 124, and thus is a good measure of the amorphous/crystalline phase configuration. The information that typically is stored into the length of the amorphous phase 126*b* is in a sense projected onto the projection liner 124. Note that even though the projection liner 124 is present during both read and write operations, the 'projection' is designed to occur only during the read process. As such, the projection liner 124 provides a parallel conduction path in the crystalline phase 126*a* and the amorphous phase 126*b* of the phase change material layer 126. The projection liner 124 acts as a parallel resistor that bypasses current around the amorphous phase 126*b*.

Another embodiment by which to fabricate a phase change memory cell with the projection liner 124 is described in detail below by referring to the accompanying FIGS. 6-12. In the present embodiment, the projection liner 124 surrounds only the top portion of the heater 116.

Figure 6:
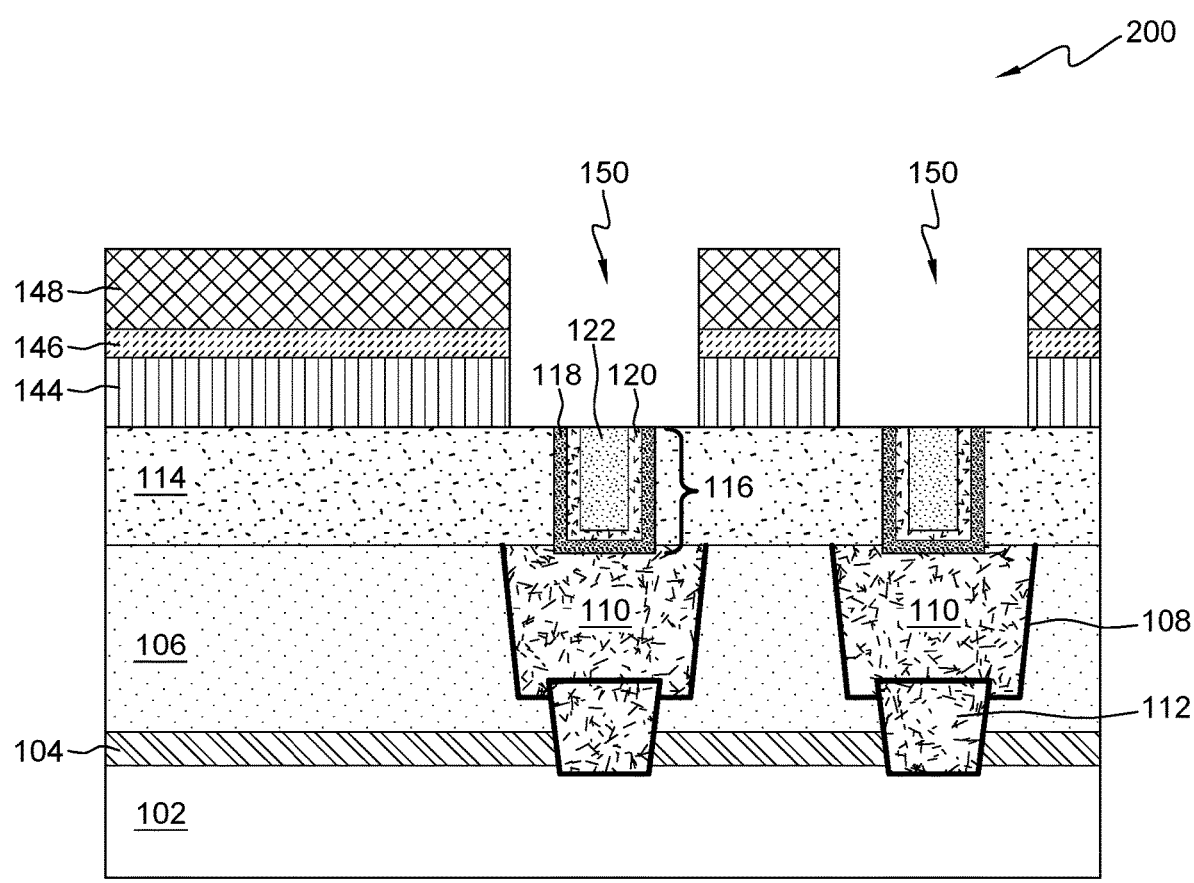
FIG. 6 is a cross section view illustrating an organic planarization layer, an antireflective coating layer, and a photoresist layer on top of the second dielectric layer according to an exemplary embodiment.

Referring now to FIG. 6, a structure 200 is shown at an intermediate step of fabrication after the heater 116 formation (as described above with respect to FIG. 1), in accordance with an embodiment of the present invention. The structure 200 may be substantially similar in all respects to the structure 100 described in detail above with respect to FIG. 1; however, in the present embodiment, the structure 200 includes an organic planarization layer (OPL) 144, an antireflective coating layer 146, and a photoresist layer 148. Beginning with the structure 100 of FIG. 1, the OPL 144 is deposited on the top surfaces of the second dielectric layer 114 and the heaters 116 to a thickness of about 200 nm. The antireflective coating layer 146 is then deposited on top of the OPL 144. The antireflective coating layer 146 is about 35 nm thick. The antireflective coating layer 146 may be a bottom antireflective coating (BARC) or a silicon containing antireflective coating (SiARC). The photoresist layer 148 may be deposited onto the top surface of the antireflective coating layer 146. The OPL 144, the antireflective coating layer 146, and the photoresist layer 148 may each be deposited using known deposition techniques, such as, for example, spin-on coating. The photoresist layer 148 is patterned to form trenches 150. The trenches 150 are formed directly above the heaters 116.

Figure 7:
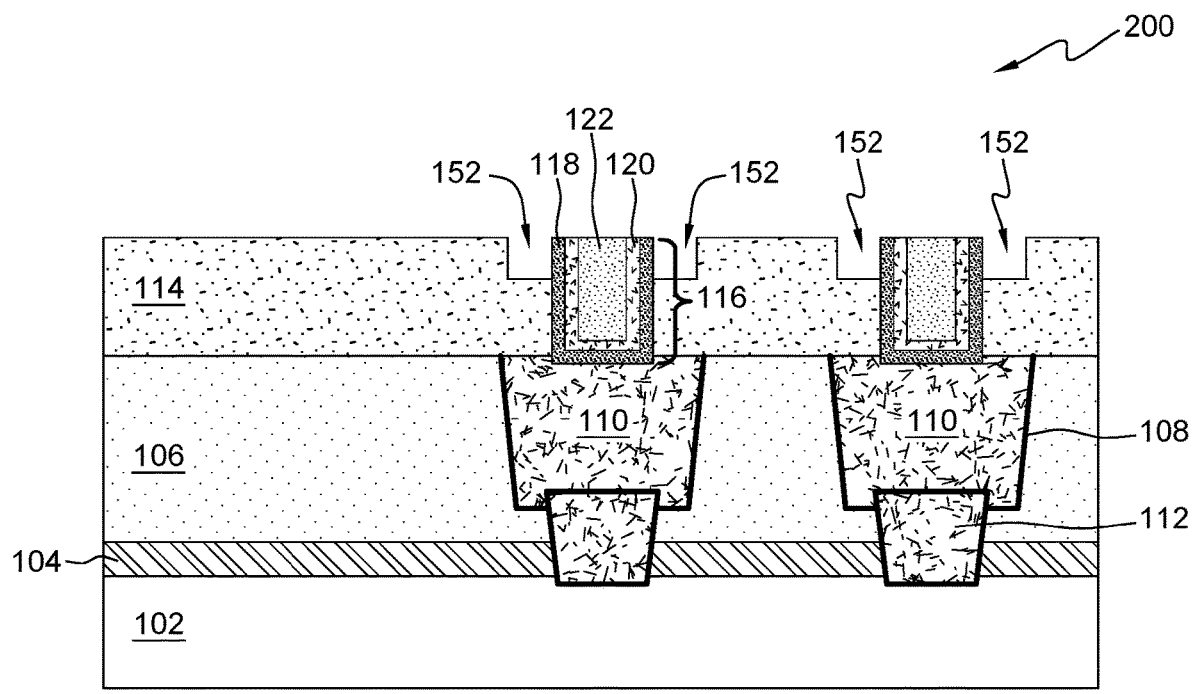
FIG. 7 is a cross section view illustrating openings around a top portion of the heaters according to an exemplary embodiment.

Referring now to FIG. 7, the structure 200 with the second dielectric layer 114 recessed around the top portion of the heaters 116 is shown, in accordance with an embodiment. After the trenches 150 are formed, both the photoresist layer 148 and the antireflective coating layer 146 are removed; however, the OPL 144 remains. Using an etch process such as, for example, a RIE process, portions of the second dielectric layer 114 surrounding the heater 116 are removed. As a result, the top portions of the heater 116 are exposed, creating openings 152. The OPL 144 is then removed, using known methods, to expose the top surface of the second dielectric layer 114.

Figure 8:
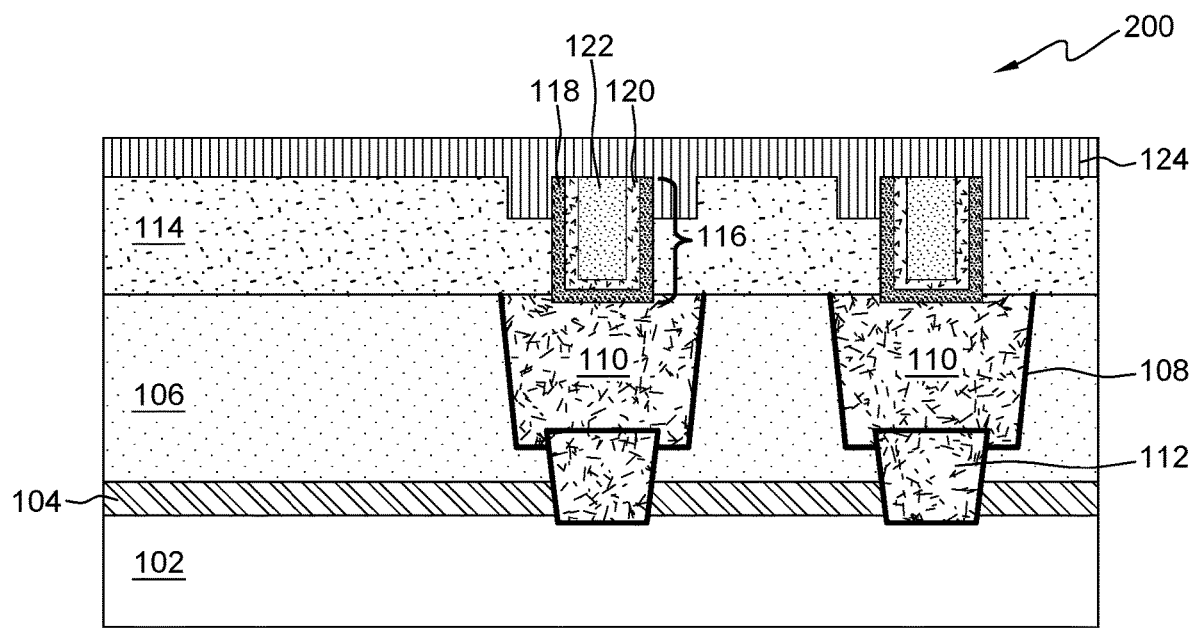
FIG. 8 is a cross section view illustrating the projection liner above the second dielectric layer according to an exemplary embodiment.

Referring now to FIG. 8, the structure 200 with the projection liner 124 is shown, in accordance with an embodiment. The projection liner 124 is deposited onto the top surface of the structure 200, filling the openings 152. The projection liner 124 surrounds the top portion of the heater 116. The projection liner 124 is made of materials whose resistivity falls between the resistivity of the crystalline and the amorphous phases of the phase change material layer.

Figure 9:
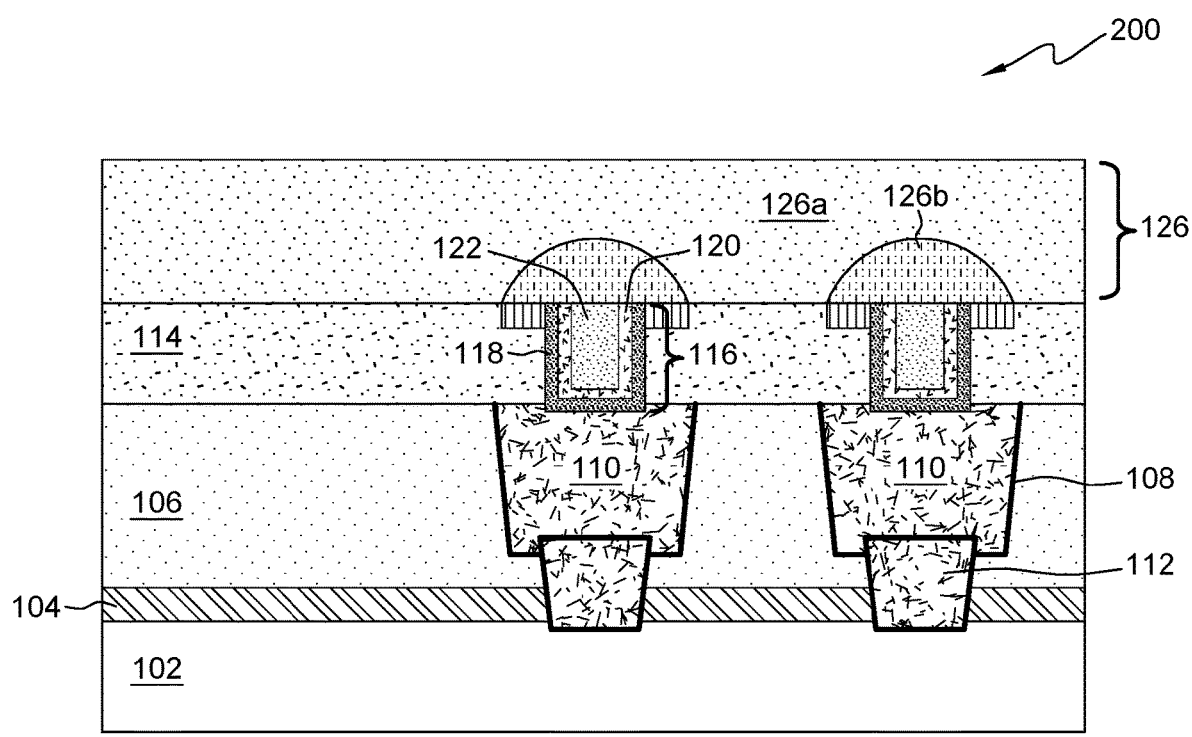
FIG. 9 is a cross section view illustrating the phase change material above the second dielectric layer according to an exemplary embodiment.

After the projection liner 124 is deposited, a CMP process is performed to remove the projection liner 124 from the second dielectric layer 114 and expose the top surfaces of the heaters 116. As a result, the projection liner 124 remains only around the top portion of the heater 116. The structure 200 undergoes further processing during which the phase change material layer 126 is deposited, as is illustrated in FIG. 9. The phase change material layer 126 includes both the crystalline phase 126*a* and the amorphous phase 126*b*.

Figure 10:
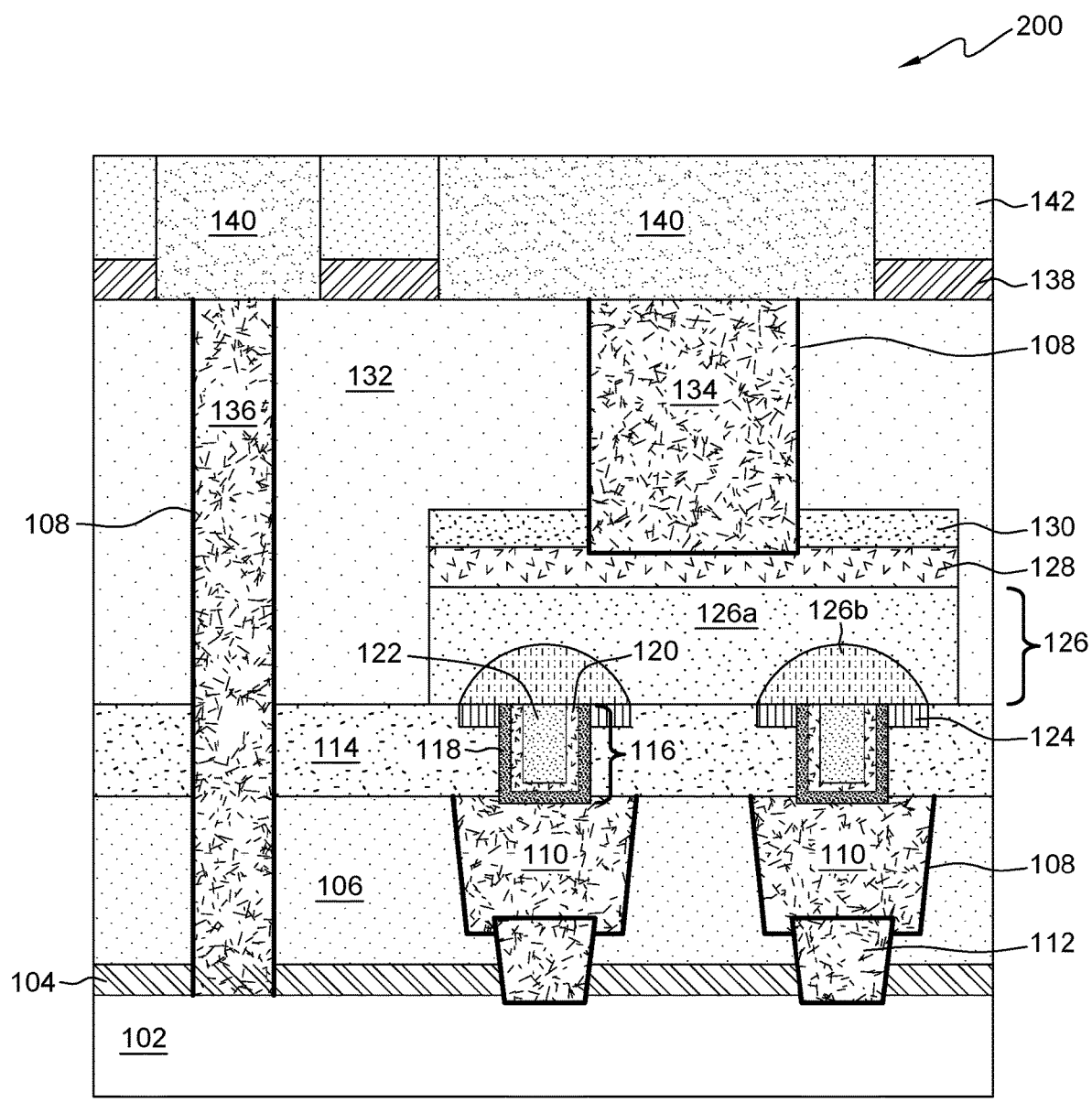
FIG. 10 is a cross section view illustrating the top electrode, the top electrode contact, the via contact, and the second metal layer on top of the top electrode contact according to an exemplary embodiment.

Referring now to FIG. 10, the structure 200 undergoes additional processing that is described in detail with reference to FIG. 5. The resultant structure 200, illustrated in FIG. 10, is substantially the same as the resultant structure 100, illustrated in FIG. 5 since both structures include the projection liner 124. However, the projection liner 124, illustrated in FIG. 5, surrounds the top portion of the heater 116 and laterally extends over the top surface of the second dielectric layer 114, effectively covering the top surface of the second dielectric layer 114. As a result, the projection liner 124 of structure 100 separates the second dielectric layer 114 from the phase change material layer 126 providing a smaller change in resistance during switching, when compared to the structure 200. The projection liner 124 of structure 200, illustrated in FIG. 10, only surrounds the top portion of the heater 116. The projection liner 124, illustrated in FIG. 10, does not laterally extend over the top surface of the second dielectric layer 114. As a result, the second dielectric layer 114 is in direct contact with the phase change material layer 126.

Another embodiment by which to fabricate a phase change memory cell with the projection liner 124 is described in detail below by referring to the accompanying FIGS. 11-13. In the present embodiment, the projection liner 124 surrounds the top portion of the heater 116 and covers the top surface of the second dielectric layer 114 and the top surface of the heater 116.

Figure 11:
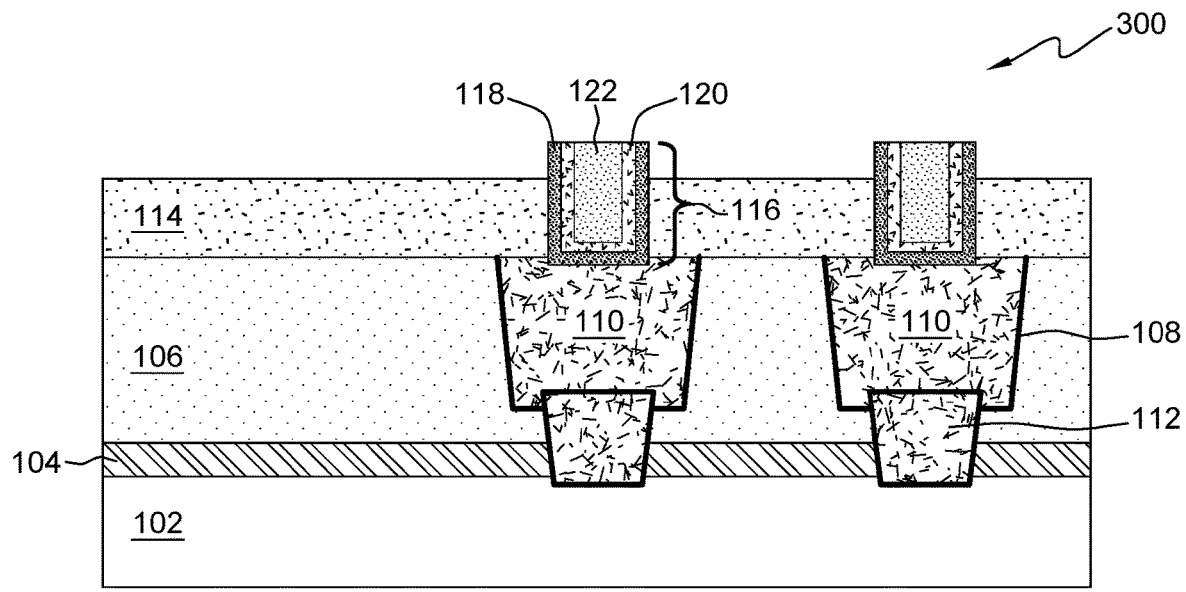
FIG. 11 is a cross section view illustrating top sidewall portions of the heaters vertically extending above the second dielectric layer according to an exemplary embodiment.

Referring now to FIG. 11, a structure 300 is shown at an intermediate step of fabrication after the heater 116 formation (as described above with respect to FIG. 1), in accordance with an embodiment of the present invention. The structure 300 may be substantially similar in all respects to the structure 100 described in detail above with respect to FIG. 1; however, in the present embodiment, the top sidewall portions of the heaters 116 are exposed and vertically extend above the top surface of the second dielectric layer 114. Beginning with the structure 100 of FIG. 1, an etch process, such as a RIE process, is performed to recess a portion of the second dielectric layer 114 thereby exposing the top portions of the heaters 116. As a result, the top portion of the heater 116 vertically extend above the second dielectric layer 114.

Figure 12:
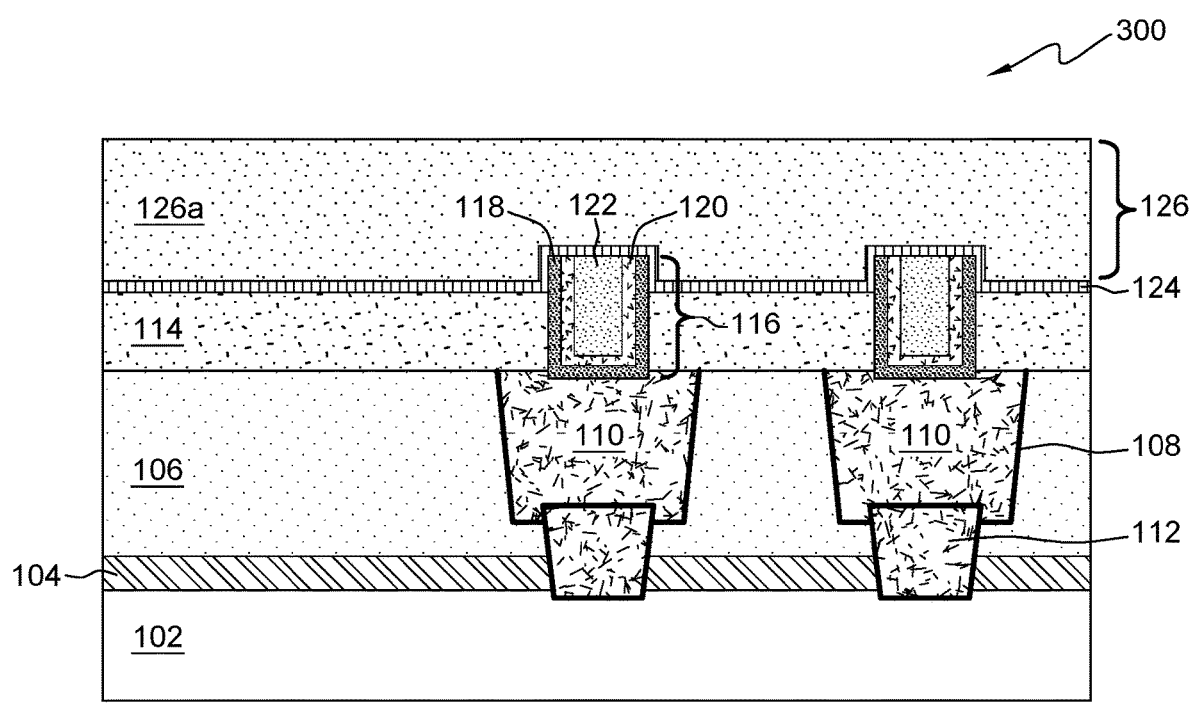
FIG. 12 is a cross section view illustrating the projection liner between the second dielectric layer and the phase change material layer according to an exemplary embodiment.

Referring now to FIG. 12, the structure 300 with the projection liner 124 and the phase change material layer 126 is shown, in accordance with an embodiment. The projection liner 124 is conformally deposited onto the top surface of the structure 300. The structure 300 then undergoes further processing during which the phase change material layer 126 is deposited on the top surface of the projection liner 124. Known deposition techniques such as, for example, ALD, may be used to deposit the projection liner 124 and the phase change material layer 126.

The projection liner 124 covers the top surface of the second dielectric layer 114, laterally extending beyond the amorphous phase 126*b* of the phase change material layer 126. The projection liner 124 separates the phase change material layer 126 from the second dielectric layer 114 and the heater 116. The projection liner 124 covers the exposed sidewall portions of the heater 116 and the top surface of heater 116. The projection liner 124 is in direct contact with the top portion of the heater 116 that vertically extends above the second dielectric layer 114. Having the projection liner 124 on top of the heater 116 reduces resistance drift.

Figure 13:
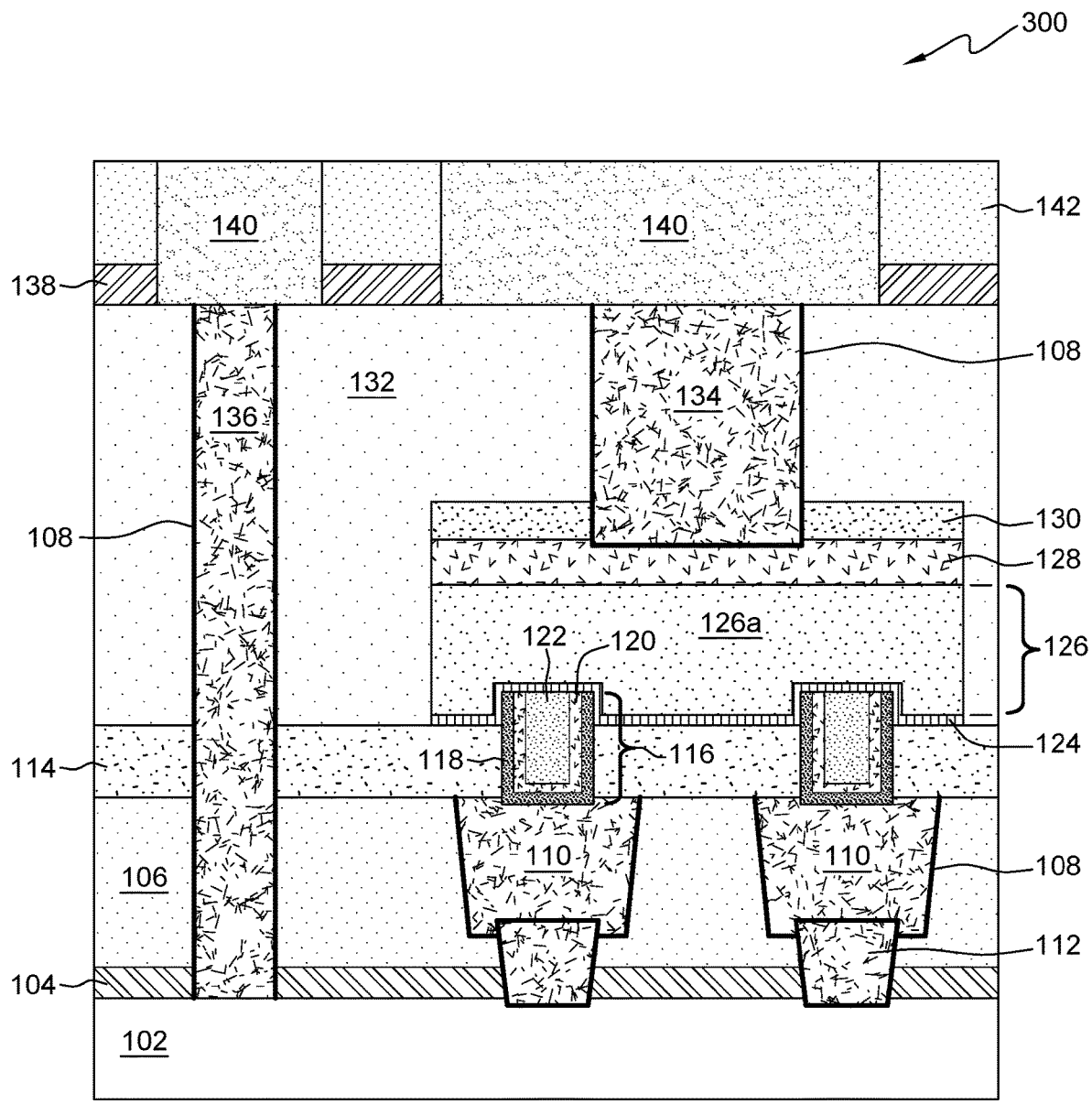
FIG. 13 is a cross section view illustrating the top electrode, the top electrode contact, the via contact, and the second metal layer on top of the top electrode contact according to an exemplary embodiment.

Referring now to FIG. 13, the structure 300 undergoes further processing as described in detail with reference to FIG. 5. The resultant structure 300, illustrated in FIG. 13, is substantially the same as the resultant structure 100, illustrated in FIG. 5 since both structures include the projection liner 124. However, the projection liner 124 of structure 100, illustrated in FIG. 5, laterally extends over the top surface of the second dielectric layer 114, effectively covering the top surface of the second dielectric layer 114. The projection liner 124 of structure 300, illustrated in FIG. 13, not only laterally extends over the top surface of the second dielectric layer 114 but also laterally extends over the top surface of the heater 116 and vertically extends over the sidewalls of the heater 116 that are above the second dielectric layer 114.

Another embodiment by which to fabricate a phase change memory cell that may reduce the programming current is described in detail below by referring to the accompanying FIGS. 14-16. In the present embodiment, the heater 116 vertically extends above the second dielectric layer 114 into the phase change material layer 126.

Figure 14:
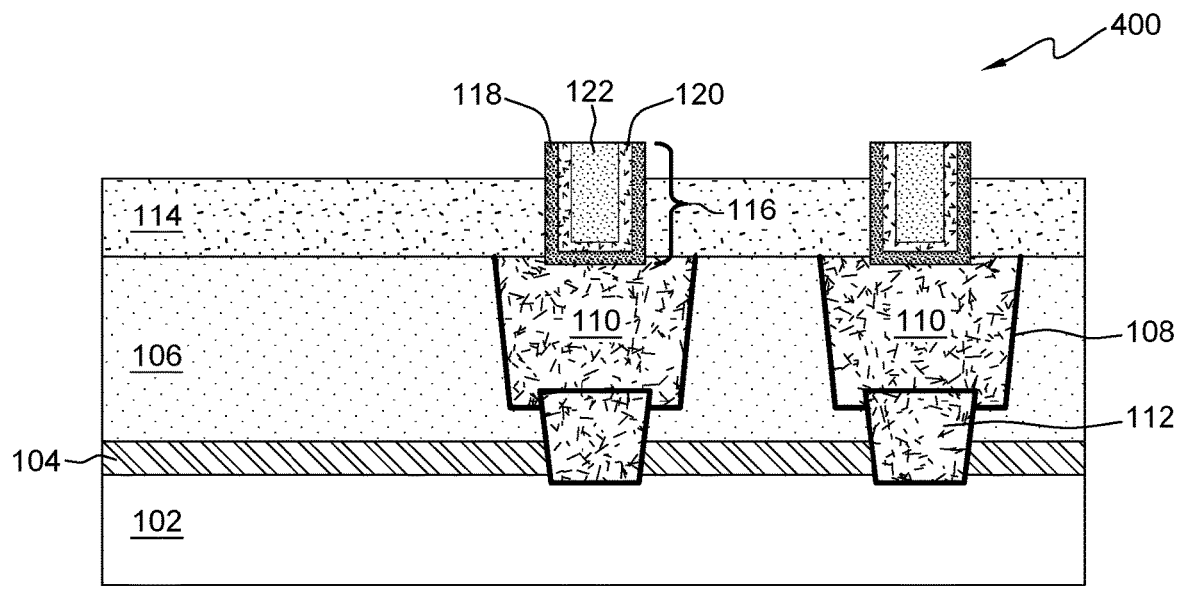
FIG. 14 is a cross section view illustrating top sidewall portions of the heaters vertically extending above the second dielectric layer according to an exemplary embodiment.

Referring now to FIG. 14, a structure 400 is shown at an intermediate step of fabrication after the heater 116 formation (as described above with respect to FIG. 1), in accordance with an embodiment of the present invention. The structure 400 may be substantially similar in all respects to the structure 100 described in detail above with respect to FIG. 1; however, in the present embodiment, the top sidewall portions of the heaters 116 are exposed and vertically extend above the top surface of the second dielectric layer 114. Beginning with the structure 100 of FIG. 1, an etch process, such as a RIE process, is performed to recess a portion of the second dielectric layer 114 thereby exposing the top portions of the heaters 116.

Figure 15:
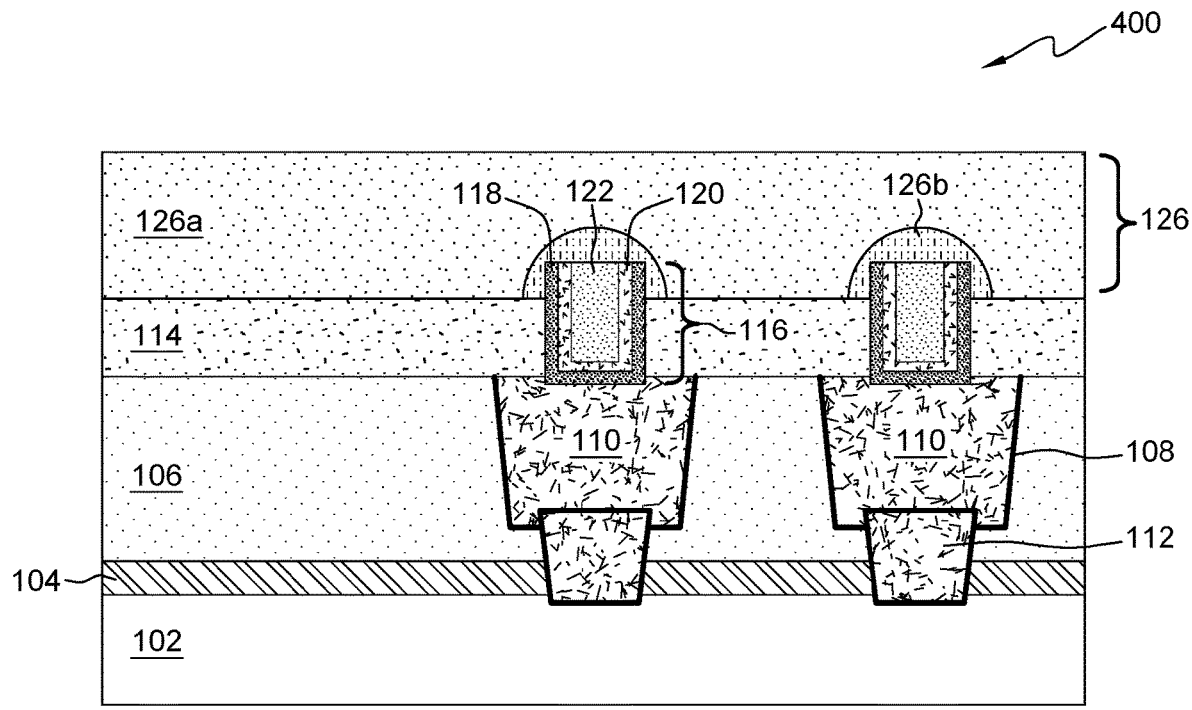
FIG. 15 is a cross section view illustrating the phase change material layer directly above the second dielectric layer according to an exemplary embodiment.
Figure 16:
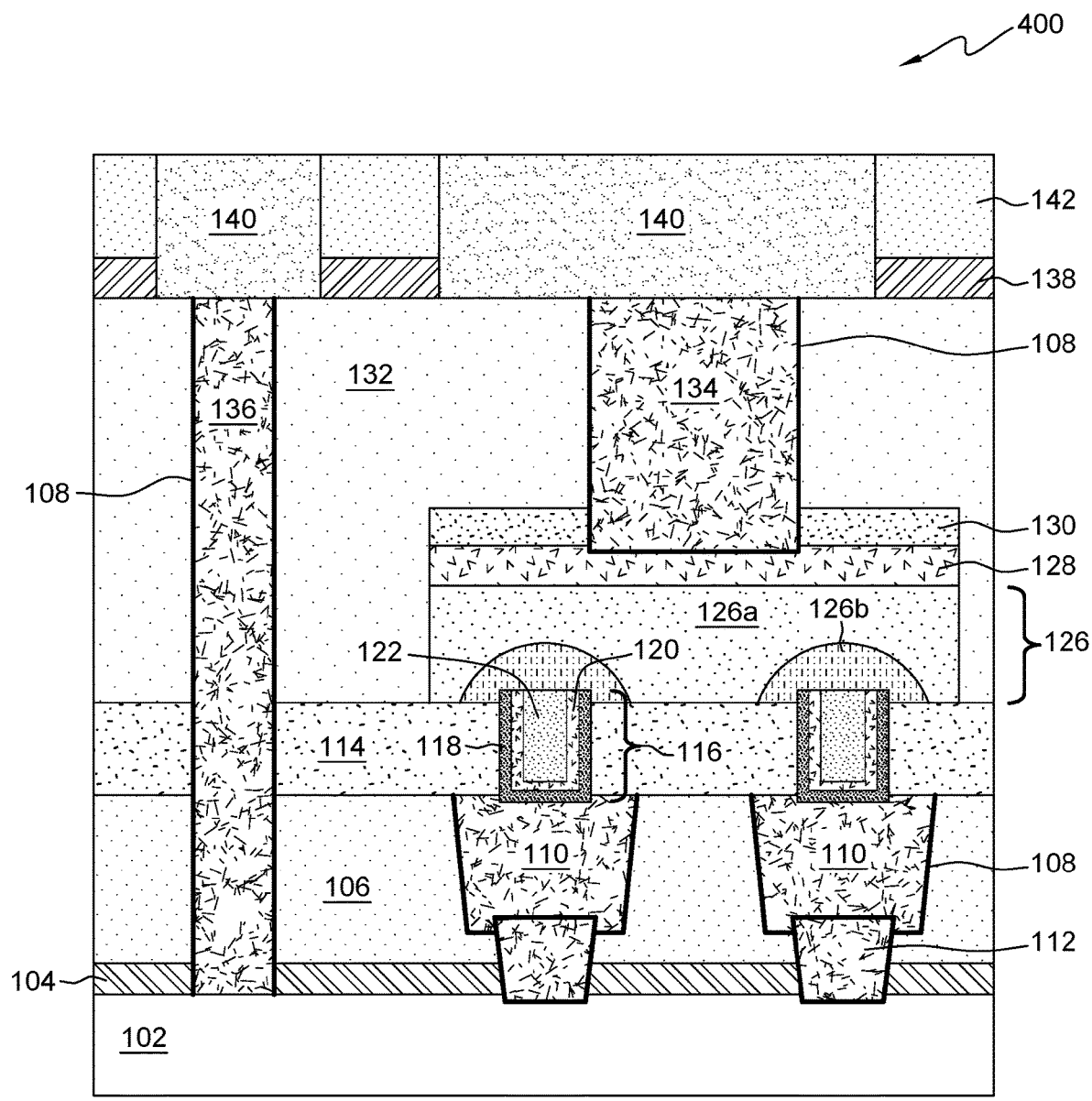
FIG. 16 is a cross section view illustrating the top electrode, the top electrode contact, the via contact, and the second metal layer on top of the top electrode contact according to an exemplary embodiment.

Referring now to FIGS. 15-16, the structure 400 undergoes further processing during which the phase change material layer 126 is deposited on the top surface of the second dielectric layer 114. Known deposition techniques such as, for example, ALD, may be used to deposit the phase change material layer 126. The bottom surface of the phase change material layer 126 is in direct contact with the top surface of the second dielectric layer 114. Further, the phase change material layer 126 surrounds the top portions of the heater 116 that were exposed as a result of the recessing of the second dielectric layer 114. The structure 400 then undergoes further processing as described in detail with reference to FIG. 5 during which the top electrode 128 and the mask layer 130 are deposited and patterned.

The resultant structure 400, illustrated in FIG. 16, is different from the structure 100 (illustrated in FIG. 5), the structure 200 (illustrated in FIG. 10), and the structure 300 (illustrated in FIG. 13) because the structure 400 does not include the projection liner 124. Rather, the structure 400 includes the heater 116 that has portions of its vertical sidewalls extend above the second dielectric layer 114. The portions of the vertical sidewalls of the heater 116 extend into the phase change material layer 126 such that the phase change material layer 126 surrounds the top portion of the heater 116 on all sides. Further, the phase change material layer 126 is above and in direct contact with the second dielectric layer 114.

Embodiments of the present invention described above illustrate a method and structure of forming a phase change memory cell that includes the projection liner 124 (structures 100, 200, 300) and the heater 116 that vertically extends above the dielectric layer 114 into the phase change material layer 126 (structure 400). The projection liner 124 and the heater 116 that vertically extends above the dielectric layer 114 provide a solution to the problem of resistance drift in phase change memory cells. The projection liner 124 is self-aligned. The projection liner 124 mitigates resistance drift by providing a current path from the bottom electrode 110 to the top electrode 128, bypassing the amorphous phase 126b of the phase change material layer 126. Further, extending portion of the heater 116 above the second dielectric layer 114 also improves programming current reduction due to the fact that the heater 116 vertically extends or protrudes into the phase change material layer 126, generating more heat around the heater 116 during programming.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
a heater surrounded by a second dielectric layer;
a projection liner on top of the second dielectric layer, wherein a top surface of the projection liner is substantially flush with a top surface of the heater; and
a phase change material layer above the projection liner, the projection liner separates the phase change material layer from the second dielectric layer.

2. The structure of claim 1, further comprising:
a bottom electrode below and in electrical contact with the heater; and
a top electrode above and in electrical contact with the phase change material layer.

3. The structure of claim 2, further comprising:
a mask layer above and in direct contact with the top electrode;
a top electrode contact above and in electrical contact with the top electrode; and
a bottom electrode contact below and in electrical contact with the bottom electrode.

4. The structure of claim 1, wherein the phase change material layer includes a crystalline phase and an amorphous phase, wherein the amorphous phase is directly above the heater.

5. The structure of claim 4, wherein the projection liner provides a parallel conduction path in the crystalline phase and the amorphous phase of the phase change material layer.

6. The structure of claim 4, wherein the projection liner laterally extends beyond the amorphous phase of the phase change material layer.

7. The structure of claim 1, wherein the heater comprises:
an outer layer;
a middle layer, wherein the middle layer is between the outer layer and an inner layer; and
the inner layer, wherein the inner layer is surrounded by the middle layer.

8. A structure comprising:
a heater within a second dielectric layer, wherein a top portion of the heater vertically extends above the second dielectric layer;

a projection liner on top of the second dielectric layer, the projection liner is on top and in direct contact with the top portion of the heater that vertically extends above the second dielectric layer; and a phase change material layer above the projection liner, the projection liner separates the phase change material layer from the heater and the second dielectric layer.

9. The structure of claim 8, further comprising:

a bottom electrode below and in electrical contact with the heater; and a top electrode above and in electrical contact with the phase change material layer.

10. The structure of claim 9, further comprising:

a mask layer above and in direct contact with the top electrode;

a top electrode contact above and in electrical contact with the top electrode; and a bottom electrode contact below and in electrical contact with the bottom electrode.

11. The structure of claim 8, wherein the phase change material layer includes a crystalline phase and an amorphous phase, wherein the amorphous phase is directly above the heater.

12. The structure of claim 11, wherein the projection liner provides a parallel conduction path in the crystalline phase and the amorphous phase of the phase change material layer.

13. The structure of claim 11, wherein the projection liner laterally extends beyond the amorphous phase of the phase change material layer.

14. The structure of claim 8, wherein the heater comprises:

an outer layer;

a middle layer, wherein the middle layer is between the outer layer and an inner layer; and the inner layer, wherein the inner layer is surrounded by the middle layer.

\* \* \* \* \*